(12) United States Patent
Li et al.

(10) Patent No.: US 11,289,471 B2
(45) Date of Patent: Mar. 29, 2022

(54) ELECTROSTATIC DISCHARGE DEVICE

(71) Applicant: GLOBALFOUNDRIES U.S. INC., Santa Clara, CA (US)

(72) Inventors: You Li, South Burlington, VT (US); Alain F. Loiseau, Williston, VT (US); Souvick Mitra, Essex Junction, VT (US); Tsung-Che Tsai, New York, NY (US); Robert J. Gauthier, Jr., Williston, VT (US); Meng Miao, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/001,009

(22) Filed: Aug. 24, 2020

(65) Prior Publication Data
US 2022/0059523 A1 Feb. 24, 2022

(51) Int. Cl.
| | | |
|---|---|---|
| *H01L 29/74* | (2006.01) | |
| *H01L 27/02* | (2006.01) | |
| *H01L 29/73* | (2006.01) | |
| *H01L 27/06* | (2006.01) | |
| *H01L 27/092* | (2006.01) | |
| *H01L 27/088* | (2006.01) | |
| *H01L 29/78* | (2006.01) | |
| *H01L 29/06* | (2006.01) | |

(52) U.S. Cl.
CPC ...... *H01L 27/0259* (2013.01); *H01L 27/0248* (2013.01); *H01L 27/0251* (2013.01); *H01L 27/0623* (2013.01); *H01L 27/0886* (2013.01); *H01L 27/0924* (2013.01); *H01L 29/0684* (2013.01); *H01L 29/73* (2013.01); *H01L 29/785* (2013.01)

(58) Field of Classification Search
CPC ... H01L 27/0251; H01L 29/73; H01L 29/785; H01L 27/0886; H01L 27/0259; H01L 27/0623; H01L 27/0924; H01L 27/0248; H01L 29/0684; H01L 29/41791
See application file for complete search history.

(56) References Cited

U.S. PATENT DOCUMENTS

| | | | |
|---|---|---|---|
| 7,646,046 B2 | 1/2010 | Russ et al. | |
| 7,964,893 B2 | 6/2011 | Lee | |
| 8,085,518 B2 | 12/2011 | Chaudhary et al. | |
| 8,569,867 B2 | 10/2013 | Inaba | |

(Continued)

FOREIGN PATENT DOCUMENTS

| | | |
|---|---|---|
| CN | 1866521 | 11/2006 |
| DE | 102013101705 | 5/2014 |

(Continued)

*Primary Examiner* — Shouxiang Hu
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to an electrostatic discharge (ESD) device and methods of manufacture. The structure (ESD device) includes: a trigger collector region having fin structures of a first dopant type, a collector region having fin structures in a well of a second dopant type and further including a lateral ballasting resistance; an emitter region having a well of the second dopant type and fin structures of the first dopant type; and a base region having a well and fin structures of the second dopant type.

20 Claims, 1 Drawing Sheet

(56) References Cited

U.S. PATENT DOCUMENTS

| | | | |
|---|---|---|---|
| 9,318,479 B2* | 4/2016 | Li | H01L 29/0649 |
| 9,368,594 B2* | 6/2016 | Chang | H01L 29/1004 |
| 9,397,098 B2 | 7/2016 | Lin et al. | |
| 9,461,170 B2 | 10/2016 | Lin et al. | |
| 10,121,860 B2* | 11/2018 | Zhou | H01L 21/308 |
| 2015/0069529 A1 | 3/2015 | Chen et al. | |
| 2016/0240525 A1 | 8/2016 | Shrivastava et al. | |
| 2018/0190644 A1* | 7/2018 | Li | H01L 29/0834 |

FOREIGN PATENT DOCUMENTS

| | | |
|---|---|---|
| KR | 101352685 | 1/2014 |
| TW | 523872 | 3/2003 |
| TW | 538520 | 6/2003 |
| TW | I290364 | 11/2007 |

* cited by examiner

ELECTROSTATIC DISCHARGE DEVICE

FIELD OF THE INVENTION

The present disclosure relates to semiconductor structures and, more particularly, to an electrostatic discharge (ESD) device and methods of manufacture.

BACKGROUND

Electrostatic discharge (ESD) is the sudden flow of electricity which can be caused by an electrical short or dielectric breakdown. ESD events can cause harmful effects including the failure of solid state electronics components such as integrated circuits. For example, transient electrical events such as ESD events can potentially lead to core circuits being damaged, resulting in gate oxide punch-through, junction damage, metal damage, and surface charge accumulation. Moreover, transient electrical events can induce latch-up, which can cause permanent damage to the circuit.

To protect the circuit, ESD devices are integrated directly into the circuits. The ESD devices can protect the circuit during manufacturing and/or operation of the circuit, itself. The ESD devices can be designed to be triggered, i.e., switched from an 'off' state to an 'on' state, when exposed to the ESD event. Under normal operation, the ESD devices are normally in their "off" state.

ESD devices can include many different types of devices. For example, an ESD device can include a lateral bipolar transistor using planar technologies. In this technology, a ballast resistance can be provided by silicide regions, as an example. For example, the ballast resistance provided by the silicided region (e.g., silicided block) will provide an added resistance which, in turn, will add additional voltage to increase a voltage drop on the pad so that other ESD devices can be turned ON. In FinFET technologies, though, there is no silicide mask to provide such ballast resistance.

SUMMARY

In an aspect of the disclosure, a structure comprises: a trigger collector region comprising fin structures of a first dopant type, a collector region comprising fin structures in a well of a second dopant type and further comprising a lateral ballasting resistance; an emitter region comprising a well of the second dopant type and fin structures of the first dopant type; and a base region comprising a well and fin structures of the second dopant type.

In an aspect of the disclosure, a structure comprises a fin based bipolar electrostatic discharge (ESD) device comprising a trigger collector region having a first well of a first dopant type and a collector region having a second well of a second dopant type, with fins of the second dopant type over the first well and the second well.

In an aspect of the disclosure, a structure comprising: a trigger collector region comprising a P-well with n-type fin structures over the P-well; a collector region directly adjacent to the trigger collector region, the collector region comprising a N-well with n-type fin structures over the N-well; an emitter region comprising the P-well with n-type fin structures over the P-well; a base region comprising the P-well with n-type fin structures over the P-well; and shallow trench isolation regions separating the collector region from the emitter region and the base region from the emitter region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an electrostatic discharge (ESD) device and methods of manufacture. More specifically, the present disclosure relates to a fin-based ESD bipolar device with lateral ballasting resistance. Advantageously, the present disclosure provides ESD performance improvement in FinFET technologies.

In embodiments, the ESD device is a fin based bipolar transistor with lateral ballasting resistance. The lateral ballasting resistance is formed in the fin-based bipolar structures for ESD performance improvement in FinFET technologies. For example, in the implementations described in the present disclosure, the bipolar structure comprises N+ fins in an emitter region, a trigger collector and a collector region, and P+ fins in a base region. The collector region is formed in a N-well region. The N-well region with its multiple fins will provide a lateral ballast resistance region.

The ESD device of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD device of the present disclosure have been adopted from integrated circuit (IC) technology. For example, the structures are built on wafers and are realized in films of material patterned by photolithographic processes on the top of a wafer. In particular, the fabrication of the ESD device uses three basic building blocks: (i) deposition of thin films of material on a substrate, (ii) applying a patterned mask on top of the films by photolithographic imaging, and (iii) etching the films selectively to the mask.

Figure 1:
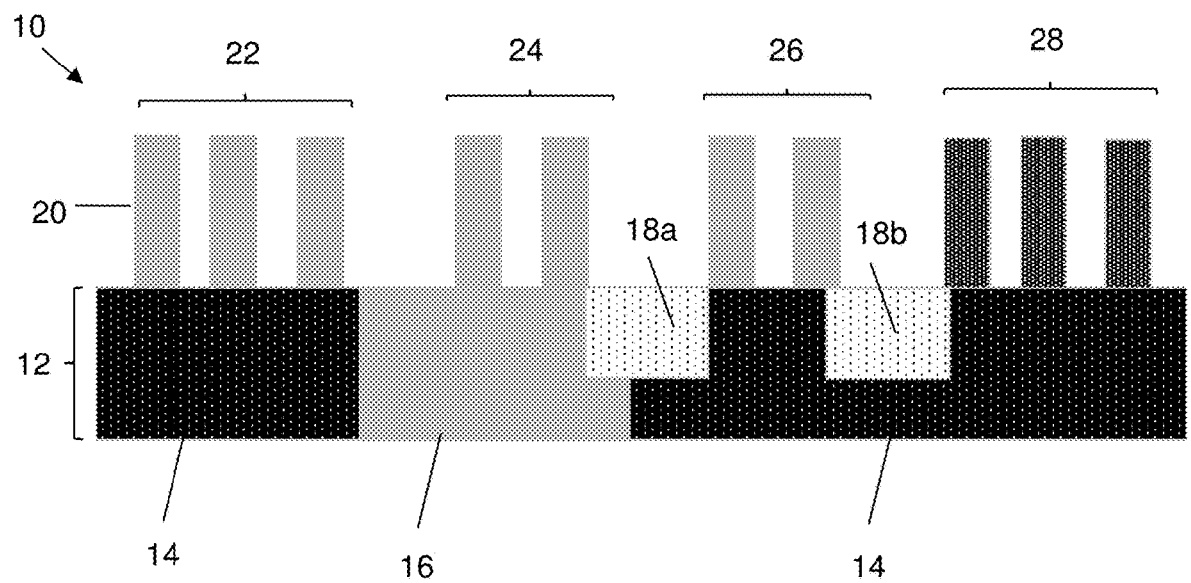
FIG. 1 shows an electrostatic discharge (ESD) device and respective fabrication processes in accordance with aspects of the present disclosure.

FIG. 1 shows an ESD device and respective fabrication processes in accordance with aspects of the present disclosure. More specifically, the ESD device 10 of FIG. 1 includes a substrate 12 composed of any suitable semiconductor material including, but not limited to, Si, SiGe, SiGeC, SiC, GE alloys, GaAs, InAs, InP, and other III/V or II/VI compound semiconductors. The substrate 12 may comprise any suitable crystallographic orientation (e.g., a (100), (110), (111), or (001) crystallographic orientation). The substrate 12 can be a single semiconducting material such as bulk silicon or composed of semiconductor on insulator (SOI) technologies.

The substrate 12 includes well 14 and well 16. In a lateral NPN bipolar application, the well 14 is a P-well and the well 16 is a N-well. In a lateral PNP bipolar application, the well 14 is a N-well and the well 16 is a P-well. The wells 14, 16 can be formed by introducing a different dopant type into the substrate 12 by, for example, deep ion implantation processes. For example, the P-well 14 is doped with p-type dopants, e.g., Boron (B), and the N-well 16 is doped with n-type dopants, e.g., Arsenic (As), Phosphorus (P) and Antimony (Sb), among other suitable examples.

In the deep ion implantation processes, respective patterned implantation masks may be used to define selected areas exposed for the implantations. The implantation mask used to select the exposed area for forming well 14 is stripped after implantation, and before the implantation mask used to form well 16 (or vice versa). Similarly, the implantation mask used to select the exposed area for forming well 16 is stripped after the implantation is performed. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

Still referring to FIG. 1, a plurality of fin structures 20 are formed from the substrate 12. The plurality of fin structures 20 can be formed prior to or after the formation of the wells 14, 16. In embodiments, the plurality of fin structures 20 can be formed by conventional lithography and etching processes including a sidewall image technique (SIT). In an example of a SIT technique, a mandrel material, e.g., $SiO_2$, is deposited on the substrate 12 using conventional chemical vapor deposition (CVD) processes. A resist is formed on the mandrel material, and exposed to light to form a pattern (openings). A RIE is performed through the openings to form the mandrels. In embodiments, the mandrels can have different widths and/or spacing depending on the desired dimensions between the fin structures 20. A SIT squared technique can be used to form different spacings between adjacent fin structures 20. Spacers are formed on the sidewalls of the mandrels which are preferably material that is different than the mandrels, and which are formed using conventional deposition processes known to those of skill in the art. The spacers can have a width which matches the dimensions of the fin structures 20, for example. The mandrels are removed or stripped using a conventional etching process, selective to the mandrel material. An etching is performed within the spacing of the spacers to form the sub-lithographic features, e.g., fin structures 20. The sidewall spacers can then be stripped.

In embodiments, the fin structures 20 are used in different regions of the ESD device 20. For example, the different regions include a trigger collector region 22, an emitter region 26 and a base region 28 over the P-well 14, and a collector region 24 over the N-well 16. Moreover, in the NPN application, the fin structures 20 in the trigger collector region 22, the collector region 24 and the emitter region 26 are n-doped fin structures; whereas, the fin structures 20 in the base region 28 are p-doped fin structures. In embodiments, the regions 22 and 24 are shorted with back end of the line (BEOL). Also, the P-well 14 and the N-well 16 in the trigger collector region 22 are directly in contact with one another. Alternatively, in the PNP application in which the well 16 is a P-well and the well 14 is a N-well, the fin structures 20 in the trigger collector region 22, the collector region 24 and the emitter region 26 are p-doped fin structures; whereas, the fins structures 20 in the base region 28 are n-doped fin structures.

As further shown in FIG. 1, the trigger collector region 22 and the base region 28 include three (3) fin structures 20 and the collector region 24 and the emitter region 26 include two (2) fin structures 20. However, it should be understood that a different number of fin structures 20 can be used in each region. For example, as an illustrative non-limiting feature, five (5) fin structures 20 can be used in the trigger collector region 22 and the base region 28.

In any scenario, the fin structures 20 are doped by undergoing a shallow ion implantation process. The shallow ion implantation process can be performed after the fin formation process and, preferably, after the deep ion implantation processes. Also, as shown in FIG. 1, the fin structures 20 in the emitter region 26 are separated from the fin structures 20 in the collector region 24 and the base region 28 by shallow trench isolation structures 18a, 18b, respectively.

As should be understood by those of skill in the art, the fin structures 20 in the collector region 24 in combination with the well 16 of a different implant dopant type, e.g., N-well, will form a lateral ballasting resistance at the trigger collector region 22, e.g., a lateral N-well resistance and vertical dummy fin resistance. The lateral ballasting resistance provides stability to the circuit by preventing over current faults. The lateral ballasting resistance is formed without a silicided block region.

Still referring to FIG. 1, a plurality of shallow trench isolation structures 18a, 18b are formed in the substrate 12. In embodiments, the shallow trench isolation structure 18a extends into the well 14 and well 16 between the collector region 24 and the emitter region 26; whereas, the shallow trench isolation structure 18b extends into the well 16 between the emitter region 26 and the base region 28.

The shallow trench isolation structures 18a, 18b can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. Following the resist removal by a conventional oxygen ashing process or other known stripants, insulator material can be deposited by any conventional deposition processes, e.g., CVD processes, to form the shallow trench isolation structures 18a, 18b.

Figure 2:
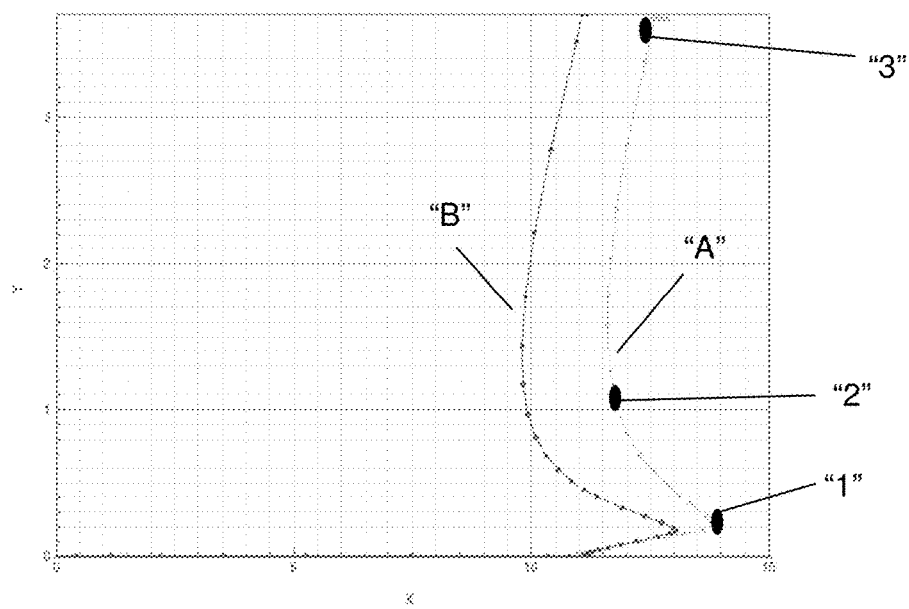
FIG. 2 shows a graph comparing the ESD device of the present disclosure with an ESD FinFET device that does not have a lateral ballasting resistance.

FIG. 2 shows a graph comparing the ESD device of the present disclosure with an ESD FinFET device that does not have a lateral ballasting resistance. In this graph, the ESD device described in the present disclosure is depicted as line "A" and the ESD FinFET device that does not have lateral ballasting resistance is depicted as line "B". The x-axis is representative of voltage and the y-axis is representative of current. As shown in the comparison graph, line "A" and line "B" behave similarly, but line "A" has a higher triggering voltage at point "1" prior to a snap back at point "2" and then failure at point "3".

More specifically, point 1 is representative of Vt1, in which the transistor is already turned ON, point 2 is representative of Vh which is when voltage of the transistor (NPN) will snap back to a lower voltage and point 3 is representative of Vt2 which is a failure of the circuit. By increasing resistance with the lateral ballasting resistance, it is possible to increase Vt1 which, in turn, will allow subsequent fingers (e.g., ESD devices) in a multi-finger appli-cation to turn ON, effectively allow all of the fingers (NPN) in the multi-finger device to turn ON and, hence, increase ESD performance.

By way of example, it is understood that Vt may be slightly different for different devices due to process variations. Also, assume that a NPN will trigger at 6 V to 7 V and the snap back is about 2 V. In this example, once snap back occurs on the first transistor (NPN) and voltage drops to about 5 V, subsequent device will be prevented from triggering (e.g., turning ON). However, by adding the lateral ballasting resistance, the triggering voltage to turn ON can be increased allowing subsequent devices in the multi-finger device to turn ON even with the snap back phenomenon. Hence, the lateral ballasting resistance formed in the fin-based bipolar structures will improve the ESD performance in FinFET technologies.

The ESD device can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a trigger collector region comprising fin structures of a first dopant type;
    a collector region comprising fin structures in a well of the first dopant type;
    a lateral ballasting resistance at the trigger collector region which comprises the collector region and the well of the first dopant type;
    an emitter region comprising a well of a second dopant type and fin structures of the first dopant type; and
    a base region comprising a well and fin structures of the second dopant type.
2. The structure of claim 1, wherein the lateral ballasting resistance is provided in a directly adjacent and contacting the collector region and comprises the well of the first dopant type.
3. The structure of claim 2, wherein the well of the first dopant type of the lateral ballasting resistance comprises a N-well and remaining portions of the trigger collector region comprise a P-well.
4. The structure of claim 3, wherein the fins of the first dopant type over the N-well comprise collector fin structures.
5. The structure of claim 4, wherein the fin structures of the first dopant type comprise n+ dopant.
6. The structure of claim 5, wherein the emitter region and the base region are provided in P-well regions, the fin structures in the emitter region are n+ doped fins and the fin structures in the base region are p+ doped fins.
7. The structure of claim 1, further comprising shallow trench isolation regions which separate the emitter region from the collector region and the emitter region from the base region.
8. The structure of claim 1, wherein the first dopant type is p+ dopant and the second dopant type is n+ dopant type.
9. The structure of claim 1, further comprising shallow trench isolation regions which separate the emitter region from the collector region and the emitter region from the base region.
10. A structure comprising a fin based bipolar electrostatic discharge (ESD) device comprising a trigger collector region having a first well of a first dopant type, and a collector region having a second well of a second dopant type, and with fins of the second dopant type over the first well and the second well.
11. The structure of claim 10, wherein the first dopant type is a p-dopant type and the second dopant type is an n-dopant type.
12. The structure of claim 11, wherein the first well of the p-dopant type and the second well of the n-dopant type are directly contacting.
13. The structure of claim 11, further comprising shallow trench isolation structures separating a base region from an emitter region and the collector region from the emitter region.
14. The structure of claim 10, wherein the first dopant type is a n-dopant type and the second dopant type is p-dopant type.
15. The structure of claim 10, wherein the second well of the second dopant type and the fins of the second dopant type are a ballast resistance region.
16. The structure of claim 15, wherein ballast resistance region is a lateral ballast resistance region.
17. A structure comprising:
    a trigger collector region comprising a P-well with n-type fin structures over the P-well;
    a collector region directly adjacent to the trigger collector region, the collector region comprising a N-well with n-type fin structures over the N-well;
    an emitter region comprising the P-well with n-type fin structures over the P-well;
    a base region comprising the P-well with n-type fin structures over the P-well; and
    shallow trench isolation regions separating the collector region from the emitter region and the base region from the emitter region.
18. The structure of claim 17, wherein the N-well with the n-type fin structures of the collector region are a lateral ballasting resistance region.
19. The structure of claim 17, wherein the P-well of the trigger collector region and the N-well of the collector region are in direct contact.

20. The structure of claim 17, wherein the collector region is between the trigger collector region and the emitter region.

\* \* \* \* \*